United States Patent
Bootle et al.

[11] Patent Number: 5,962,348
[45] Date of Patent: Oct. 5, 1999

[54] METHOD OF MAKING THERMAL CORE MATERIAL AND MATERIAL SO MADE

[75] Inventors: John D. Bootle, Bennington, Vt.; Frank Burzesi, Troy, N.Y.

[73] Assignee: XC Associates, Troy, N.Y.

[21] Appl. No.: 09/035,550

[22] Filed: Mar. 5, 1998

[51] Int. Cl.$^6$ ............................ B32B 18/00; B32B 7/12
[52] U.S. Cl. ...................... 442/265; 442/72; 442/101; 442/151; 442/136; 442/212; 442/229; 442/263; 442/267; 156/64; 156/174; 156/308; 501/80; 501/307.4; 165/133; 165/104.12; 165/170; 165/80.2; 428/36.2; 428/71; 428/102; 428/105; 428/131; 428/141; 428/209; 428/367
[58] Field of Search ........................... 428/36.2, 71, 105, 428/102, 131, 141, 209, 367; 442/72, 101, 151, 136, 212, 229, 263, 265, 267; 156/64, 174, 308; 501/80, 307.4; 165/133, 56, 80.3, 46, 104.12, 45, 80.2, 80.5, 185, 41, 81, 82, 170

[56] References Cited

U.S. PATENT DOCUMENTS

| | | |
|---|---|---|
| 4,284,072 | 8/1981 | McKaveney . |
| 4,737,421 | 4/1988 | Uemura et al. ........................... 429/34 |
| 4,776,602 | 10/1988 | Gallo . |
| 4,816,289 | 3/1989 | Komatsu et al. ..................... 423/447.3 |
| 4,832,118 | 5/1989 | Scanlon et al. ......................... 165/164 |
| 4,867,235 | 9/1989 | Grapes et al. . |
| 4,878,152 | 10/1989 | Sauzade et al. ........................ 361/386 |
| 4,882,089 | 11/1989 | Iwaskow et al. ........................ 428/242 |
| 4,897,286 | 1/1990 | Kosuda et al. . |
| 4,902,453 | 2/1990 | Okura et al. . |
| 4,975,261 | 12/1990 | Takabatake . |
| 5,039,577 | 8/1991 | Knoell et al. . |
| 5,111,359 | 5/1992 | Montesano .............................. 361/388 |
| 5,205,353 | 4/1993 | Willemsen et al. . |
| 5,255,738 | 10/1993 | Przilas . |
| 5,294,460 | 3/1994 | Tani et al. . |
| 5,467,814 | 11/1995 | Hyman et al. ............................. 165/41 |
| 5,513,070 | 4/1996 | Xie et al. ................................ 361/700 |
| 5,542,471 | 8/1996 | Dickinson . |
| 5,660,917 | 8/1997 | Fujimori et al. ........................ 428/195 |
| 5,665,464 | 9/1997 | Takayasu et al. . |
| 5,817,404 | 10/1998 | Kawakita et al. ....................... 428/209 |
| 5,824,996 | 10/1998 | Kochman et al. ...................... 219/529 |
| 5,849,130 | 12/1998 | Browne ................................... 156/256 |

FOREIGN PATENT DOCUMENTS

| | | |
|---|---|---|
| 1286768 | 1/1962 | France . |
| 767963 | 2/1957 | United Kingdom . |

*Primary Examiner*—Marion McCamish
*Assistant Examiner*—Arti R. Singh
*Attorney, Agent, or Firm*—Schmeiser, Olsen & Watts

[57] ABSTRACT

The present invention discloses a method a method of making a material for thermal cores and the material so made. In particular, the present invention disclose a method including the steps of applying thermally conductive particles over at least a portion of a fiber layer, providing another fiber layer upon the fiber layer, and repeating the above steps as desired. In another aspect of the present invention is disclosed a method of making a thermally conductive material including applying thermally conductive particles upon at least a portion of a fiber prepreg layer, providing another fiber prepreg layer upon the fiber layer, repeating the above steps as desired, and bonding the fiber prepreg layers, including the thermally conductive particles, together. The material in accordance with the present invention includes a plurality of layers made of thermally conductive fibers bonded by a resin, and a plurality of interposed layers of resin having a high concentration of high conductivity particles therein.

45 Claims, 3 Drawing Sheets

METHOD OF MAKING THERMAL CORE MATERIAL AND MATERIAL SO MADE

BACKGROUND OF THE INVENTION

1. Technical Field

The present invention relates generally to thermal cores. More particularly, it relates to a method of making a thermal core material and the material so made.

2. Related Art

Thermal cores are devices which are used to mount electronic circuit boards and to aid in conducting heat away from the circuit boards. In the related art, layered carbon fiber laminates, i.e., prepregs, have been used in thermal cores because of the high thermal conductivity of carbon. Further, the high thermal conductivity carbon fibers, such as P100, P120, K1100 manufactured by Amoco Advanced Composites Corp., offer more lightweight high stiffness than traditional aluminum cores. However, while these carbon fibers all have exceptionally high axial thermal conductivity, they exhibit very low transverse conductivity, i.e., transverse to the length of the fiber. Accordingly, when these fibers are used in a composite laminate in layers, the in plane thermal conductivity is very high but the transverse thickness conductivity is very low and usually limited by the resin that is used to bond the carbon fibers together.

The following related art, which is hereby incorporated by reference, have attempted to increase the transverse conductivity in a number of ways. For instance, as illustrated by U.S. Pat. No. 5,255,738 to Przilas and assigned to E-Systems, Inc., it is known to bond a metal cap to the edge of the core at the card guide interface to improve the heat transfer from side to side. Further, as exemplified by U.S. Pat. No. 4,975,261 to Takabatake and assigned to Petoca, Ltd., it is known to load a liquid with a carbonaceous material and then immerse a bundle of carbon fiber therein during manufacture of the prepreg. Additionally, as illustrated by U.S. Pat. No. 4,902,453 to Okura et al. and assigned to Across Co., Ltd., it is known to provide a mixed powder including finely divided carbonaceous binder pitch and finely divided coke between reinforcing fibers of a composite, i.e., during prepreg manufacture.

The above references, however, add complexity and cost to the manufacturing process, and weight to the thermal core. In particular, the addition of a metal cap is expensive, and adds weight and an additional thermal interface that presents long term reliability issues because of the bond. The addition of carbon material to resins prior to immersion of the fiber layers therein results in an unacceptable loss of strength and an unfocused dispersion of thermally conductive particles in the composite. Further, addition of material to the resin may contaminate other aspects of the prepreg manufacturing process.

Accordingly, there has been a need for a carbon fiber thermal core manufacturing process which increases transverse conductivity of a fiber thermal core, but maintains manufacturing costs, complexity and low weight.

SUMMARY OF THE INVENTION

In a first general aspect in accordance with the present invention is provided a method of making a material for thermal cores including the steps of applying thermally conductive particles over at least a portion of a fiber layer, providing another fiber layer upon the fiber layer, and repeating the above steps as desired. Accordingly, in accordance with the present invention, thermally conductive particles are applied at the lay up stage (i.e., where layers of fiber material are laid atop one another for formation into a layered composite) of thermal core production rather than during prepreg production.

In a second general aspect in accordance with the present invention is provided a method of making a thermally conductive material including applying thermally conductive particles upon at least a portion of a fiber prepreg layer, providing another fiber prepreg layer upon the fiber layer, repeating the above steps as desired, and bonding the fiber prepreg layers, including the thermally conductive particles, together.

In a third general aspect of the present invention is provided a material including a plurality of layers made of thermally conductive fibers bonded by a resin, and a plurality of interposed layers of resin having a high concentration of high thermal conductivity particles therein.

The processes of the present invention make it possible to economically treat small quantities of material which would be expensive to do during manufacture of prepreg. Addition of high thermally conductive particles during thermal core lay up also prevents pollution of the prepreg production line.

Another advantage of the present invention is the allowance for localization of thermally conductive particles in the core to selectively enhance thermal conductivity where necessary. As a result, lowered costs of manufacturing may be realized because less particle material is used.

Another advantage of the present invention is that the placing of thermally conductive particles during lay up operation ensures that the particles are concentrated at the interface between the layers of prepreg, and, hence, provide a more efficient thermal path between fiber layers.

Yet another advantage is found in the applicability of the present invention to hand lay up or machine lay up, and the simplicity of implementation.

Another advantage of the present invention is the enhanced thermal performance exhibited by the material. In particular, the material prepared in accordance with the present invention demonstrates enhanced through thickness thermal conductivity, and lower thermal resistance between a core and any heat sink to which it is attached, e.g., a card guide. As a result, the present invention provides significantly reduced component temperatures and improved thermal core performance through an increase in transverse thermal conductivity.

The foregoing and other features and advantages of the invention will be apparent from the following more particular description of preferred embodiments of the invention.

BRIEF DESCRIPTION OF THE DRAWINGS

The preferred embodiments of this invention will be described in detail, with reference to the following figures, wherein like designations denote like elements, and wherein.

DESCRIPTION OF THE PREFERRED EMBODIMENTS

Although certain preferred embodiments of the present invention will be shown and described in detail, it should be understood that various changes and modifications may be made without departing form the scope of the appended claims. The scope of the present invention will in no way be limited to the number of constituting components, the materials thereof, the shapes thereof, the relative arrangement thereof, etc., and are disclosed simply as an example of the preferred embodiment.

Figure 1:
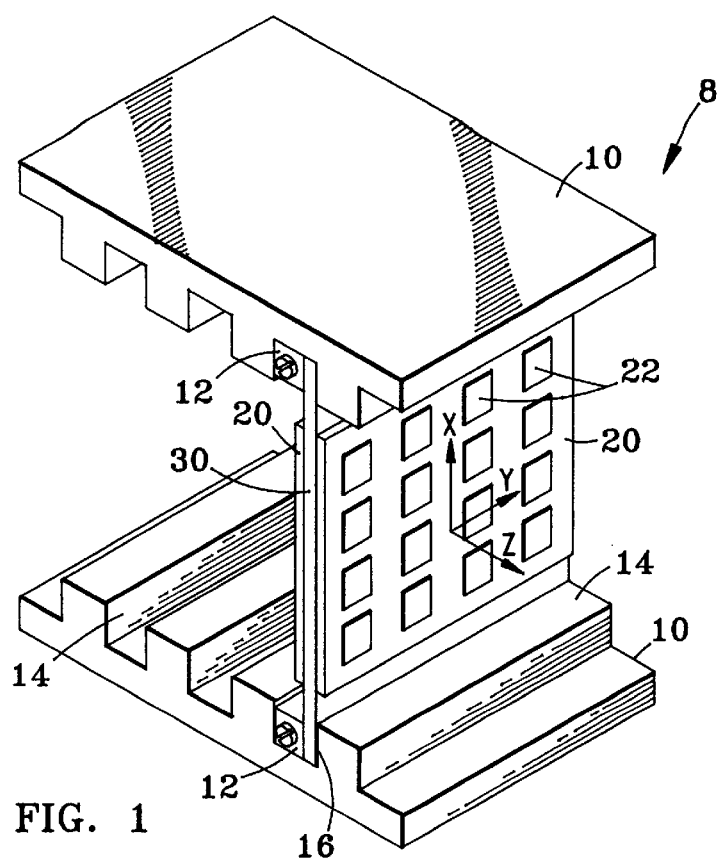
FIG. 1 shows perspective view of an electronic system using a thermal core in accordance with a preferred embodiment of the present invention.
Figure 2:
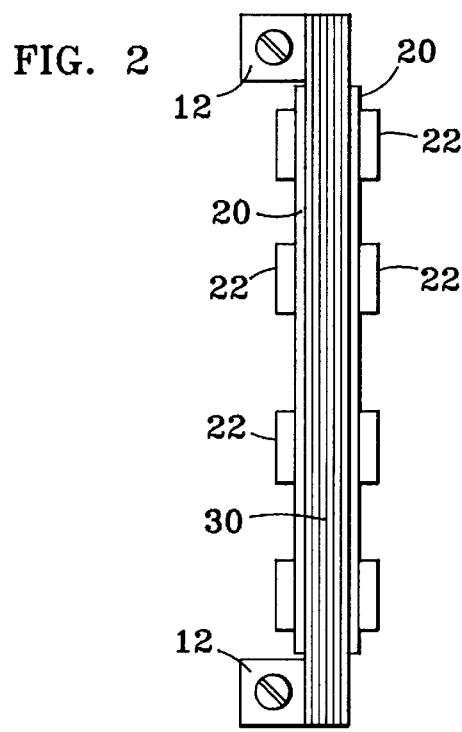
FIG. 2 shows a side view of a thermal core in accordance with a preferred embodiment of the present invention.

Referring to FIG. 1, an exemplary thermal core and electronic system 8 are shown. While the thermal core 30 and electronic circuit boards 20 have been shown in a specific setting, it is important to note that the system shown is provided for overall explanation of thermal cores and is, therefore, not to be taken as a limiting feature of the present invention. Generally, a thermal core system includes at least one heat sink 10 that includes a plurality of card guide interfaces 14 therein for holding electronic circuit boards 20. Further, as best shown in FIG. 2, the electronic circuit boards 20 comprise a number of electronic components 22 which if not cooled properly will malfunction or be destroyed.

In order to conduct heat away from the circuit boards 20, the circuit boards 20 are bonded to a thermal core 30. The thermal core 30 is then coupled to the heat sink(s) 10 by a clamp 12 that expands to hold the thermal core 30 in the card guide interface 14 of the heat sink(s) 10. Heat is then transferred from the electronic components 22 through the thermal core 30 and thermal interface 16 to the heat sink(s) 10. Other cooling processes may also be added to the thermal core 30 if necessary. For instance, a conduit (not shown) may be formed longitudinally through the thermal core 30 to allow for fluid cooling, e.g., liquid or air, therethrough.

The fiber composite thermal core 30 prepared in accordance with the present invention is formed from layers of fiber composites, generally referred to as "prepregs". Prepregs are defined, for purposes of this application, as ready-to-mold material in sheet or layer form made of cloth, mat, fiber, or paper impregnated with resin. The resin may take a variety of forms such as thermosets or thermoplastics. In the preferred embodiment, the resin is in the form of a cyanide ester thermoset. Examples of thermoset resins that may be used are: phenolics, polyesters, epoxies, bismaleimides, polyimides, and cyanates. Examples of thermoplastics are polystyrene, nylon, polycarbonate, acryclics, and vinyls. Prepregs are stock items supplied to a fabricator who then "lay up" the material for production of a thermal core, i.e., cuts the prepregs to a desired shape, layers them, and completes the cure with heat and pressure.

For purposes of thermal core manufacture, the resin in prepregs is normally partially cured to a "B-stage", i.e., a stage at which the resin is not completely cured but is tacky. However, prepregs may come in a variety of forms. For instance, prepregs may come as: 1) commercial prepregs, where the material is coated in a hot melt or solvent system according to customer requirements, and 2) wet prepreg, where the basic resin is installed without solvents or preservatives but has a limited room temperature shelf life. See Vol. 1, Engineered Material Handbook, Composites, ASM International, page 19.

In terms of the fibers used in the thermal core prepregs, carbon fibers are the most preferable because of their high thermal conductivity. In particular, materials such as P100, P120 or K1100 Thornel graphite fibers manufactured by Amoco Advanced Composites Corp. may be used. For the present invention, K13C2U/954-2A, manufactured by Fiberite Corp. of Tempe, Ariz. has been found to be most preferable. It is important to note, however, that any equivalently performing thermally conductive fiber material may be used for the prepreg layers. Furthermore, referring to FIGS. 3 and 4, it should be recognized that the fibers 36 may be in a single direction within a prepreg layer $L_1$, i.e., may be undirectional, or woven together, i.e., a matrix.

Regardless of the alignment of the fibers 36, however, a difficulty with carbon fibers is that their ability to thermally conduct heat transverse to the fiber is not nearly as great as their thermal conductivity along the fiber. As a result, referring to FIG. 1, once the fibers 36 are formed into a core 30, thermal conductivity in the transverse direction Z to the X–Y plane of the core 30 is poor.

Figure 3:
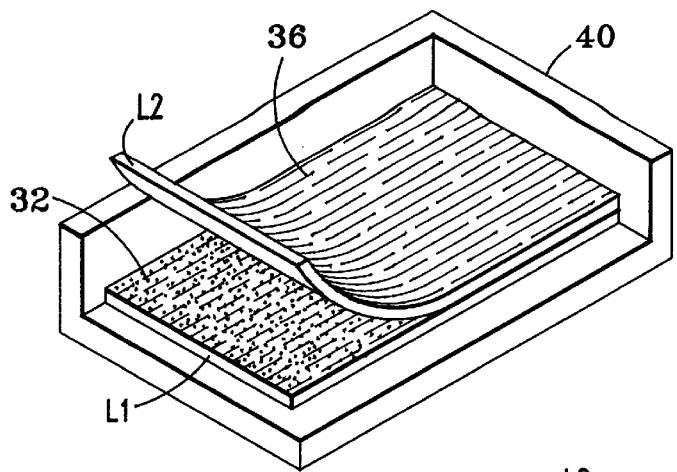
FIG. 3 shows a perspective view of a straight fiber layer of a thermal core in accordance with a preferred embodiment of the present invention.
Figure 4:
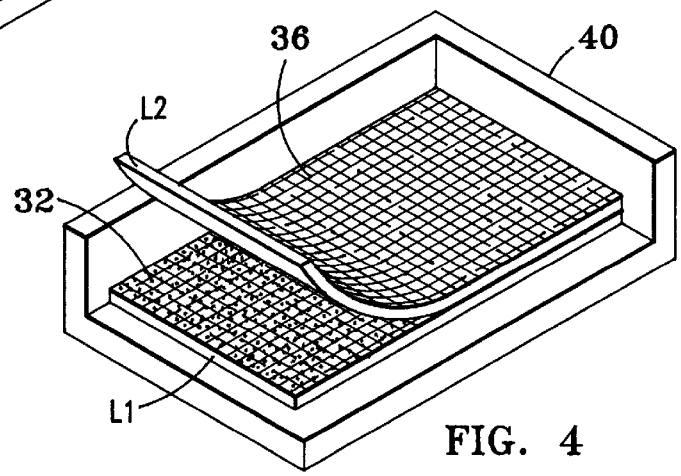
FIG. 4 shows a perspective view of a woven fiber layer of a thermal core in accordance with a preferred embodiment of the present invention.

The process of manufacturing a thermal core 30 in accordance with the present invention will now be described in conjunction with FIGS. 3 and 5–7. Referring to FIG. 3, in accordance with the present invention, a prepreg layer $L_1$, is cut to a desired shape and size, and is laid in a form or mold 40. If desired, a plurality of prepreg layers may simultaneously be made for efficiency. It is also important to note that while the layers illustrated are rectangular, the shape and size may vary according to the particular setting in which the thermal core 30 is to be used.

Next, high thermal conductivity particles 32 are spread across substantially all of the surface area of the prepreg layer $L_1$. In terms of the materials to be used, it has been found that any prepreg-compatible, thermally conductive material may be used. Major considerations for the choice of particles 32 are: thermal conductivity of the material, compatibility with the prepreg resin and fiber, and particle size. Examples of usable materials are carbon and aluminum powders. However, it has also been found that a highly thermally conductive, non-metallic particle 32 is preferred to prevent corrosion within the core 30. In this regard, silicon nitride and boron nitride have been used with success with boron nitride, grade PT640 manufactured by Advanced Ceramics Corp., being the most preferable material because of its corrosion resistance as compared to metallic substances.

For the size of the particles, it has been found that it is advantageous for the particles to be in the range of 5–100 microns, and preferably about 40 microns. Further, it has been found to be beneficial to have the particles of differing sizes within the given range. To accommodate the differing sized particles, using a powder material has been found to be preferable. In terms of particle distribution, the particles should be distributed evenly across the prepreg layer $L_1$ in the range of 0.01 to 10 grams per square inch of the prepreg layer $L_1$ depending on the type and size of the particles.

Figure 6:
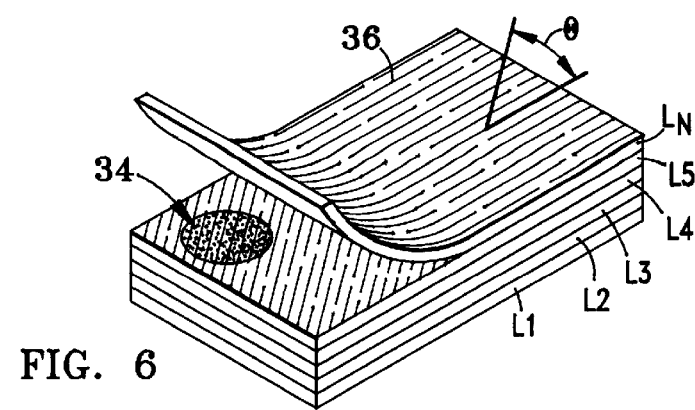
FIG. 6 shows a perspective view of the process of manufacture of a thermal core prepared in accordance with a preferred embodiment of the present invention.

As an alternative to distributing the particles 32 across substantially all of the surface area of the prepreg layer $L_1$, as shown in FIG. 6, the high thermal conductivity particles 34 may be provided over only a specified portion of the prepreg layer $L_1$. The concentration of particles would be similar to that above. Providing the particles 34 over only a portion of the prepreg layer will provide a fabricator with the ability to create thermal cores 30 with increased thermally conductive attributes at specified locations. For instance, if a particular electronic component 22 creates significantly more heat than neighboring components which do not require as much heat transfer, then it may be more cost effective to only provide the thermally conductive particles 34 near that particular component.

Figure 5:
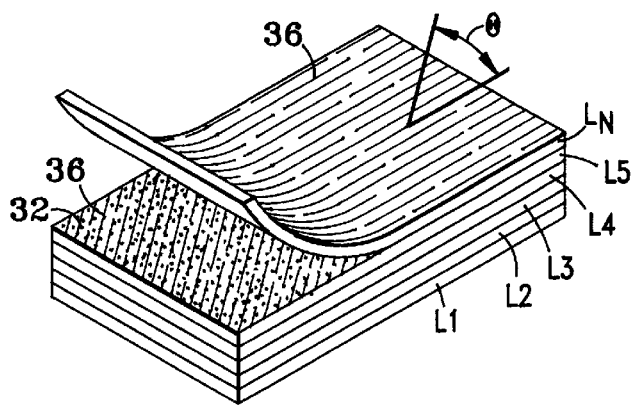
FIG. 5 shows a perspective view of the process of manufacture of a thermal core in accordance with a preferred embodiment of the present invention.

As shown in FIG. 3, the next step of the fabrication is to apply another prepreg layer $L_2$ over the top of the prepreg layer $L_1$. As shown in FIGS. 5 and 6, the above process of applying high thermal conductivity particles 32 or 34, and covering with another prepreg layer $L_N$ (where N is an integer) is then repeated until the desired thickness for the thermal core 30 is reached. During fabrication, a manufacturer may also find it beneficial to angle the direction at which the fibers of one layer $L_N$ lay compared to an adjacent layer $L_{N-1}$. In particular, laying the fibers at an angle promotes the planar structural strength of the core 30, spreads heat out into the body of the core 30, and controls thermal expansion of the core 30. For instance, as shown in FIGS. 5 and 6, if prepreg layers with unidirectional fibers 36 are used, the fabricator may lay down the layers $L_N$ such that they are at an angle θ relative to those of an adjacent prepreg layer $L_{N-1}$.

Figure 7:
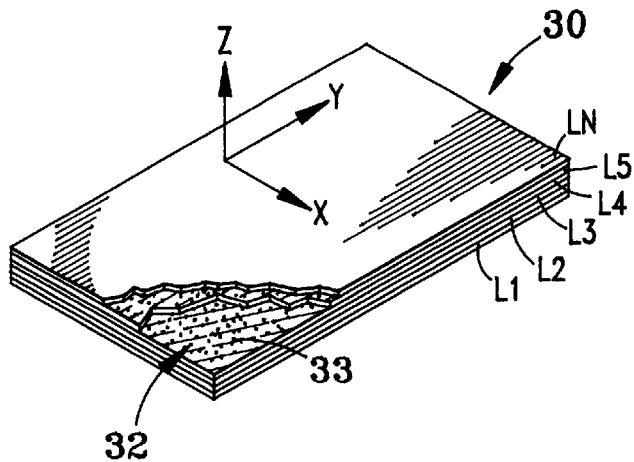
FIG. 7 shows a perspective view of a thermal core prepared in accordance with a preferred embodiment of the present invention.

Once the desired number of prepreg layers has been provided, the core 30 is completed by applying heat, in the range of 250–350° F. depending on the materials chosen, and pressure to the layers to complete the cure of the resin in the prepreg layers $L_1$–$L_N$ and to bond the layers together. The result is a thermal core 30, as shown in FIG. 7, having a plurality of layers $L_1$–$L_N$ with interposed layers of resin 33 having a high concentration of thermally conductive particles 32 therein. The resulting thermal core 30 exhibits increased transverse thermal conductivity along a transverse axis of the thermal core Z.

Figure 8:
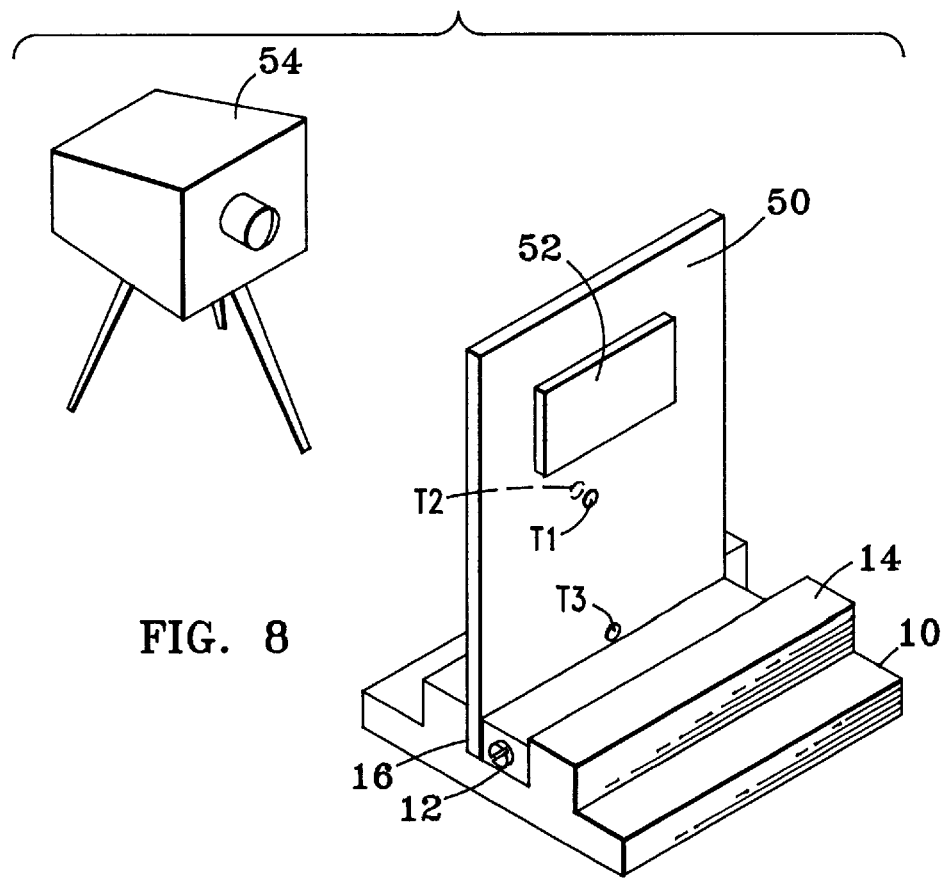
FIG. 8 shows a perspective view of a thermal core test for the thermal core prepared in accordance with the present invention.

Referring to FIG. 8, a thermal conductivity test for the thermal cores 50 is shown. In order to test the thermal conductivity, a heater 52 was bonded to each thermal core 50. To test a wider range of heat settings two power settings of a heater were used: 8.5 W and 10 W.

During testing, three types of thermal cores 50 were tested: aluminum 6061 (Al), composite material that was untreated with particles 32, 34, and a composite thermal core (CT) in accordance with the present invention. Both composite thermal cores used K13C2U type fiber and both had the same layer lay-up, i.e., the angling of the fibers through the layers were the same.

In order to determine the transverse conductivity, the temperature of the thermal cores 50 were measured at thermocouples $T_1$ and $T_2$ which are located at the longitudinal midpoint but on opposite sides of the cores 50. Additionally, the temperature was determined at $T_3$ at the base of the thermal core 50. A thermally sensitive camera 54 was also used to confirm testing. The results of the testing are as follows:

TABLE 1

Temperature gradient ΔT through core T2-T3

| Thermal core | ΔT Q = 8.5 watts | ΔT Q = 10 watts |
|---|---|---|
| Al | 0.0° C. | 0.0° C. |
| C | 0.5° C. | 0.6° C. |
| CT | 0.1° C. | 0.1° C. |

TABLE 2

Thermal conductivity of thermal cores

| Thermal core | Thermal conductivity $K_a$ |
|---|---|
| Al | 180 w/m/K |
| C | 275 w/m/K |
| CT | 350/ w/m/K |

TABLE 3

Thermal interface resistance R between core and heat sink, i.e., at interface 16

| Thermal core | R |
|---|---|
| Al | 0.93 in$^2$ °C./W |
| C | 0.78 in$^2$ °C./W |
| CT | 0.41 in$^2$ °C./W |

From the above data, it is clear that the treated composite (CT) in accordance with the present invention exhibits the lowest temperature differential across the cores made of a composite material, and hence the greatest thermal conductivity. Furthermore, as shown in Table 3, the core made in accordance with the present invention exhibits the lowest thermal interface resistance R at interface 16.

While this invention has been described in conjunction with the specific embodiments outlined above, it is evident that many alternatives, modifications and variations will be apparent to those skilled in the art. Accordingly, the preferred embodiments of the invention as set forth above are intended to be illustrative, not limiting. Various changes may be made without departing from the spirit and scope of the invention as defined in the following claims.

We claim:

1. A method of making a material for thermal cores comprising the steps of:
    applying thermally conductive particles to form a layer of thermally conductive particles over at least a portion of a thermally conductive fiber layer;
    providing another thermally conductive fiber layer upon the thermally conductive fiber layer and layer of thermally conductive particles;
    repeating the above steps as desired; and
    bonding the thermally conductive fiber layers and thermally conductive particle layer together.

2. The method of claim 1, wherein the thermally conductive fiber layers are prepregnated with a resin to bond the thermally conductive fibers.

3. The method of claim 2, wherein the bonding step includes applying heat and pressure to the thermally conductive fiber layers to bond the layers, including the layers of thermally conductive particles.

4. The method of claim 2, wherein the resin is chosen from: phenolics, polyesters, epoxies, bismaleimides, polyimides, and cyanates.

5. The method of claim 2, wherein the thermally conductive fiber layers include thermally conductive fibers.

6. The method of claim 5, wherein the thermally conductive fibers are made of carbon.

7. The method of claim 5, wherein the thermally conductive fibers are woven within a thermally conductive fiber layer.

8. The method of claim 5, wherein the thermally conductive fibers are unidirectional within a thermally conductive fiber layer.

9. The method of claim 8, wherein the thermally conductive fibers of a given fiber layer are angled relative to an adjacent fiber layer.

10. The method of claim 1, wherein the step of bonding includes applying heat and pressure to the thermally conductive fiber layers to bond the layers, including the layers of thermally conductive particles.

11. The method of claim 10, wherein the thermally conductive fibers are made of carbon.

12. The method of claim 1, wherein the thermally conductive fiber layers include thermally conductive fibers.

13. The method of claim 12, wherein the thermally conductive fibers are unidirectional within a thermally conductive fiber layer.

14. The method of claim 13, wherein the thermally conductive fibers of a given fiber layer are angled relative to an adjacent fiber layer.

15. The method of claim 12, wherein the thermally conductive fibers are woven within a thermally conductive fiber layer.

16. The method of claim 1, wherein the step of applying the thermally conductive particles includes applying the thermally conductive particles over substantially all of the surface area of the thermally conductive fiber layer.

17. The method of claim 1, wherein the thermally conductive particles are of differing size.

18. The method of claim 1, wherein the thermally conductive particles are a powder.

19. The method of claim 1, wherein the thermally conductive particles are chosen from: carbon, silicon nitride, and boron nitride.

20. The method of claim 1, wherein the thermally conductive particles have size in the range of 5–100 microns.

21. The method of claim 1, wherein the thermally conductive particles are applied with a distribution in the range of 0.01 to 10 grams per square inch of the fiber layer.

22. The method of claim 1, wherein the bonding step includes applying heat in a range of about 250° to 350° F.

23. A method of making a thermally conductive material comprising the steps of:
   applying thermally conductive particles upon at least a portion of a surface of a fiber prepreg layer;
   providing another fiber prepreg layer upon the fiber layer;
   repeating the above steps as desired; and
   bonding the fiber prepreg layers, including the thermally conductive particles, together.

24. The method of claim 23, wherein the step of bonding includes applying heat and pressure to the fiber prepreg layers, including the thermally conductive particles, once a desired thickness of material has been achieved.

25. The method of claim 23, wherein the fiber prepreg layers include thermally conductive fibers.

26. The method of claim 23, wherein the thermally conductive fibers are made of carbon.

27. The method of claim 23, wherein the thermally conductive fibers are unidirectional within a fiber prepreg layer.

28. The method of claim 23, wherein the thermally conductive fibers of a given fiber prepreg layer are angled relative to an adjacent fiber prepreg layer.

29. The method of claim 23, wherein the thermally conductive fibers are woven within a fiber prepreg layer.

30. The method of claim 23, wherein the step of applying the thermally conductive particles includes applying the thermally conductive particles over substantially all of the surface of the fiber prepreg layer.

31. The method of claim 23, wherein the thermally conductive particles are of differing size.

32. The method of claim 23, wherein the thermally conductive particles are a powder.

33. The method of claim 23, wherein the thermally conductive particles are chosen from: carbon, silicon nitride, and boron nitride.

34. The method of claim 23, wherein the thermally conductive particles have size in the range of 5–100 microns.

35. The method of claim 23, wherein the thermally conductive particles are applied with a distribution in the range of 0.01 to 10 grams per square inch of the fiber prepreg layer.

36. The method of claim 23, wherein the bonding step includes applying heat in a range of about 250° to 350° F.

37. A material comprising:
   a plurality of layers made of thermally conductive fibers bonded by a resin; and
   a plurality of interposed layers of resin having a high concentration of high thermal conductivity particles therein.

38. The material of claim 37, wherein the fibers are carbon fibers.

39. The material of claim 37, wherein the thermally conductive fibers of each layer are unidirectional.

40. The material of claim 37, wherein the fibers of a given layer are non-aligned with the fibers of an adjacent layer.

41. The material of claim 37, wherein the particles are of differing size.

42. The material of claim 37, wherein the particles are a powder.

43. The material of claim 37, wherein the thermally conductive fibers are woven within a fiber layer.

44. The material of claim 37, wherein the thermally conductive particles are chosen from: carbon, aluminum, silicon nitride, and boron nitride.

45. The material of claim 37, wherein the thermally conductive particles have size in the range of 5–100 microns.

* * * * *